United States Patent [19]

Griffith et al.

[11] Patent Number: 5,708,116
[45] Date of Patent: Jan. 13, 1998

[54] LOW DIELECTRIC CONSTANT ALLYLICS

[75] Inventors: James R. Griffith, Lanham; Henry S. W. Hu, Derwood, both of Md.

[73] Assignee: The United States of America as represented by the Secretary of the Navy, Washington, D.C.

[21] Appl. No.: 455,606

[22] Filed: May 31, 1995

[51] Int. Cl.$^6$ ................................ C08G 77/24
[52] U.S. Cl. .................. 528/42; 528/15; 528/31
[58] Field of Search ................... 528/42, 31, 15

[56] References Cited

U.S. PATENT DOCUMENTS

| | | | |
|---|---|---|---|
| 3,422,131 | 1/1969 | Pittman et al. | 528/42 |
| 3,876,677 | 4/1975 | Wu | 528/42 |
| 4,996,277 | 2/1991 | Bradshaw et al. | 528/15 |
| 5,292,927 | 3/1994 | Griffith et al. | 560/221 |
| 5,298,291 | 3/1994 | Klinger et al. | 427/513 |
| 5,436,309 | 7/1995 | Boutevin et al. | 528/25 |

OTHER PUBLICATIONS

Hawley's Condensed Chemical Dictionary, pp. 1034, 1037, 1038 1993.

*Primary Examiner*—Margaret W. Glass
*Attorney, Agent, or Firm*—Thomas E. McDonnell; George A. Kap

[57] ABSTRACT

A reaction product of a liquid monomeric allyletherfluoroalkylene benzene and a liquid polymethylhydrosiloxane, which reaction product in a cured, solid state has dielectric constant below about 2.5.

13 Claims, No Drawings

LOW DIELECTRIC CONSTANT ALLYLICS

FIELD OF INVENTION

This invention pertains to network polymers of an allyletherfluoroalkylene benzene and a silane.

DESCRIPTION OF PRIOR ART

Network polymers are three dimensional polymers which can be in a partially cured state where there are many unreacted cites, or in a cured state where most, if not all, unreacted cites are reacted and the resulting polymer is cross-linked. Fluorinated, cured network polymers generally have low dielectric constants.

Dielectric constant is defined as a measure of the ability of a dielectric to store an electric charge. A dielectric is a nonconducting substance or an insulator. Dielectric constant is directly proportional to capacitance of a material, which means that capacitance is reduced if dielectric constant of a material is reduced. For high frequency and high-speed digital circuits, capacitance of substrates and coatings are critical to reliable functioning of the circuits. Present computer operations are limited by the coupling capacitance between circuit paths and integrated circuits on multilayer boards. The computing speed between integrated circuits is reduced by this capacitance and the power required to operate them is increased.

With recent trends toward microminiaturization and utilization of very thin conductor lines, close spacings, and very thin insulation of 5 mils or less, greater demands are being placed on the insulating layer. Insulating materials must possess very low dielectric constants and at the same time must retain other required engineering and manufacturing properties. For high frequency linear circuits, such as those used in radar assemblies, the dielectric constant of insulators again becomes important, especially since it may vary with changes in frequency.

Poly(tetrafluoroethylene), which is a solid at room temperature and is known as Teflon® dielectric material, has dielectric constant in the range of 2.00–2.08 while its monomer, tetrafluoroethylene, is a gas at room temperature. Poly(tetrafluoroethylene) is completely chemically inert, has excellent electrical properties, has outstanding stability, and retains mechanical properties at high temperatures. The problem with poly(tetrafluoroethylene) is that it is not easily processable. Teflon® AF dielectric material, a commercial material, is believed to be a terpolymer of tetrafluoroethylene, perfluoropropylene and a derivative of hexafluoroacetone. Teflon® AF material is believed to have a dielectric constant in the range of 1.89–1.92 and although it is more processable than poly(tetrafluoroethylene), it still lacks adequate processability for electronic applications.

Multilayer printed circuit boards have been made of organic polymers, such as glass epoxy resins, since such materials have a low dielectric constant of about 4, however, it is impossible to directly mount integrated circuit chips in such boards because of their poor thermal resistance and inadequate physical properties to produce many insulated internal layers. This brought forth alumina ceramic circuit boards but problems were encountered due to the high dielectric constants of 9 to 10. With the advent of super computers, there is a tendency to use pulses with high frequency. At high frequency, the delay of propagation of signals is increased due to the relatively high dielectric constant of the insulating material. Also, there is an increase in electrostatic capacitance between adjacent wiring conductors which results in attenuation of signals as well as decrease in circuit impedance, if high dielectric constant insulator materials are used for insulators.

U.S. Pat. No. 5,292,927 to Griffith and Hu discloses processable highly fluorinated aromatic components characterized by acrylic and other groups attached to a benzene group having dielectric constants below about 2.5.

SUMMARY OF INVENTION

An object of this invention is allyletherfluoroalkylene benzene network polymers which are processable and have dielectric constants below about 2.5 in their solid, cured state.

Another object of this invention is liquid, parially cured network polymers of allyletherfluoralkylene benzenes and compounds containing silicon and hydrogen atoms, which polymers are more easily processable at about room temperature than Teflon AF and can be cured or crosslinked to a solid sate at an elevated temperature.

Another object of this invention is solid, cured network fluorinated phenylallylethersiloxane polymers which have oxidative stability, thermal stability, hydrophobicity, and dielectric constants below about 2.5.

These and other objects of this invention are accomplished by processable liquid, partially or fully cured solid fluorinated phenylallylethersiloxane network polymers which have dielectric constants below about 2.5.

DETAILED DESCRIPTION OF INVENTION

This invention generally pertains to partially cured network polymers of an allyletherfluoroalkylene benzene and a silane, particularly a polyalkylhydrosiloxane, and to solid polymers thereof having dielectric constants below about 2.5.

The partially cured network polymers referred to herein are liquid at room temperature and can be prepared by reacting, in presence of a catalyst, an allyletherfluoroalkylene benzene monomer in liquid state at about room temperature with a silane, particularly a polyalkylhydrosiloxane, where the resulting material is a three dimensional polymer which has some, but not all, hydrogens on the silane reacted with some, but not all, of the unsaturated cites on the allyletherfluoroalkylene benzene. Viscosity of these partially cured network polymers varies from thin to syrupy liquids which enables their use to impregnate reinforcing materials, such as fiber glass scrim, used in making wiring boards or circuit boards or other components used in electrical or electronic applications. To enable use of the highly fluorinated partially cured network polymers disclosed herein where impregnation or other processing steps are involved, the polymers are in liquid form, having viscosity below about 10,000 centistokes at 25° C, which genarally denotes a solid state, and typically below about 100 centistokes at 25° C.

Since the partially cured network polymers suitable herein for electronic applications are liquids at room temperature, they are easily processable and can be used to impregnate reinforcing material or can be used in other ways to form solid plastic components after being cured to a solid state.

Suitable partially cured and cured network polymers contain the following connecting unit:

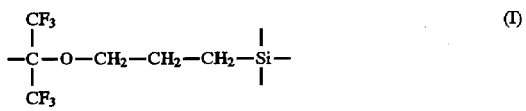

The terminal carbon atom of the above connecting unit is bonded to at least a bivalent benzene ring, preferably to a benzene ring having the connecting unit at positions 3 and 5, especially at positions 1, 3 and 5, as shown below:

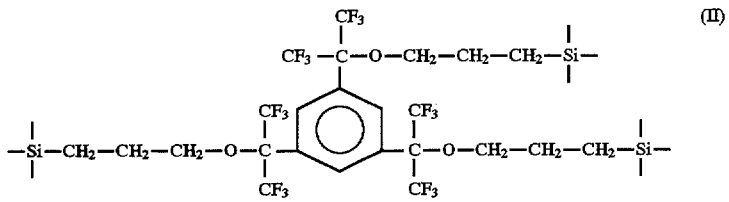

Typically, two of the three remaining positions on the silicon atoms are bonded to an oxygen atom and the remaining third position is bonded to a monovalent substituent selected from hydrogen and lower alkyl groups of 1 to 6 carbon atoms, particularly methyl or ethyl groups. The oxygen atoms on the silicon atom are further bonded to silicon atoms which have bonded thereto the connecting units, oxygen atoms and substituents, as described.

When two of the three of the positions 1, 3, 5 on the benzene ring are bonded to the connecting units, the third is selected from groups having the following structure:

where $R^2$ is selected from hydrogen and groups of 1–18 carbon atoms, especially fluorinated hydrocarbon groups of 2–6 carbon atoms such as the hexafluoroisopropyl group; $R^3$ is a straight or branched chain alkylene group of 1–6 carbon atoms; t is 2–12, depending on the number of carbon atoms in the group; and $R^4$ is selected from hydrogen and groups of 1–18 carbon atoms, especially fluorinated hydrocarbon groups of 2–6 carbon atoms such as $CF_3$ and $C_2F_5$ groups.

The partially cured network polymers can be prepared by reacting an allyletherfluoroalkylene benzene with a compound containing a silicon atom and a hydrogen atom bonded to the silicon atom, in a mutual solvent. Suitable allyletherfluoroalkylene benzenes include those liquids that have the following structure:

where at least two of the $R^5$, $R^6$ and $R^7$ groups are the allyletherfluoroalkylene groups, particularly groups having the following structure:

where $R^8$ is a straight or branched alkylene of 1–6 carbon atoms and q is 2–12. In a preferred embodiment, at least two of the groups are the following:

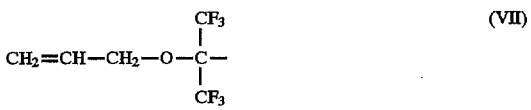

i.e., allyletherhexafluoroisopropyl group.

Where two of the $R^5$, $R^6$ and $R^7$ groups are allyletherfluoroalkylene groups, the third is selected from groups having the following structure:

and

where $R^9$ is selected from hydrogen and groups of 1–18 carbon atoms, especially fluorinated hydrocarbon groups of 2–6 carbon atoms such as the hexafluorisopropyl group; $R^{10}$ is a straight or branched chain alkylene group of 1–6 carbon atoms, and t is 2–12; and $R^{11}$ is selected from hydrogen and groups of 1–18 carbon atoms, especially fluorinated hydrocarbon groups of 2–6 carbon atoms such as $CF_3$ and $C_2F_5$ groups.

The silane suitable herein is characterized by the —Si—H group and is typically a siloxane characterized by the —Si—O— group and especially a polysiloxane, particularly a polyalkylhydrosiloxane characterized by the following structure:

where n is such that the polyalkylhydrosiloxane is a liquid at room temperature, preferably 2 to 6 and $R^{12}$ is a monovalent substituent such as a lower alkyl group of 1–6 carbon atoms. In a preferred embodiment, $R^{12}$ is methyl or ethyl, particularly methyl. Typical silanes include dimethyl silane, tetramethyl disiloxane and especially the commercially available polymethylhydrosiloxane, which is a liquid.

The reaction between an allyletherfluoroalkylene benzene and a silane can be carried out by mixing the reactants on an equivalent basis at room temperature in presence of a trace amount of catalyst in the presence of oxygen. Trace amount of catalyst is typically a fraction of 1 weight percent. The catalyst is typically platinum, palladium, rhodium or another metal that promotes the reaction. The allyletherfluoroalkylene benzene should not be purified by distillation due to the temperature required, at which it deteriorates. Purification can be carried out by percolating a solution thereof through neutral alumina.

An excess of any of the reactants should be avoided since an excess of any reactant can introduce thermal instability into the partially cured network polymer. This thermal instability can adversely impact thermal instability of the cured or crosslinked polymer. The degree of hydrosilation or conversion of the monomer can be easily monitored by Fourier Transform infrared spectrophotometer by examining the intensity of the absorbing frequency at 2171 cm$^{-1}$, which is assigned to the Si—H functional groups.

The allyletherfluoroalkylene benzene can be prepared, for example, by reacting a fluorinated phenyl alcohol, either a diol or a triol, with an allyl halide in a solvent at reflux conditions.

The reaction between an allyletherfluoroalkylene benzene and a silane results in addition between the reactants. An addition reaction is illustrated below between allylether-hexafluoroisopropyl group and a silane group:

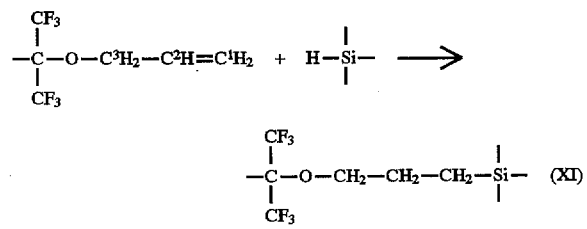

The above reaction illustrates addition of the silane group across the double bond of the allylic group. The above reaction demonstrates addition of the hydrogen atom from the silane group to carbon #2 of the allyloetherhexafluoroisopropyl group and the silicon atom of the silane group to carbon #1 of the allyletherhexafluoroisopropyl group.

The allylic moiety in the allyletherfluoroalkylene benzene has preference for reacting with another component, not itself. As demonstrated above, this means that a reaction of the allylic double bond with a silane group is preferred to the reaction of the allylic double bond with one of its own groups. Reaction of the allylic moiety with one of its own groups would lead to the undesired homopolymerization in this context.

For curing or crosslinking of the uncured copolymer to take place, temperature thereof can be quickly raised to allow the hydrogen and silicon atoms of the silane group to add across the allylic double bonds. The curing temperature is typically above 100° C. and below 200° C. and curing duration is typically in excess of 10 minutes and below about one hour. The partially cured network polymers can cure to cured network polymers without phase separation and in the presence of oxygen. Some volume shrinkage is observed during curing.

The cured polymers of this invention are semitransparent hard solids. In a partially cured state, the polymers are frangible. Upon full cure, they become more resilient. Since allyletherfluoroalkylene benzene containing two allylic groups has a functionality of four and an allyletherfluoroalkylene benzene containing three allylic groups has functionality of four, curing of the partially cured polymers containing these compounds or derivatives thereof leads to a highly crosslinked, solid, three dimensional network.

The cured network polymers are tough, rugged materials in a solid state which are not easily damaged by impact or mechanical abuse and can be handled as free-standing thin samples.

The dielectric constant values noted herein are complex permitivities. The measurements were performed on a Hewlett Packard 8722C Automated Network Analyzer using a transmission line method with rectangular waveguides after a full two-port internal waveguide calibration. The complex permitivities were calculated from the measured scattering parameters using a Nicholson and Ross algorithm.

The invention having been generally described, the following example is given as a particular embodiment of the invention to demonstrate the practice and advantages thereof. It is understood that the example is given by way of illustration and is not intended to limit in any manner the specification or any claims that follow.

EXAMPLE

This example demonstrates preparation of the trialyletherfluoroisopropyl benzene (trimer), a partially cured network polymer thereof with polymethylhydrosiloxane, and the cured network polymer.

The trimer was prepared by adding dropwise in 30 minutes 31.6 grams or 261 millimoles of allyl bromide to a solution of 40.0 grams or 69.4 millimoles of the fluorinated phenyl alcohol in 500 ml of dry acetone in an ice water bath under nitrogen, as illustrated below:

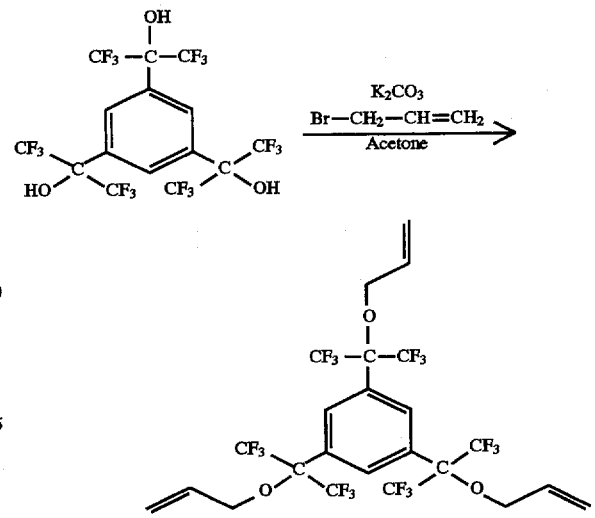

Ten minutes following addition of the last drop of allyl bromide, 32.0 grams or 231 millimoles of potassium carbonate was added in three minutes in portions and stirred for one-half hour at 0° C. followed by stirring for one hour at room temperature of about 22° C., as the reaction mixture warmed to room temperature. The reaction mixture was then slowly heated to reflux in one hour and was kept refluxing for another twelve hours. The reaction mixture was worked up by filtering it through Celite filter and evaporating it at reduced pressure and in vacuum at 30° C. for three hours to yield 48.4 grams of liquid.

The liquid was dissolved in 200 ml of mixed hexanes, twice percolated through a column of 80 grams of neutral alumina, and each time was washed with 150 ml of mixed hexanes. The resulting liquid was evaporated at aspirator pressure and then in vacuum at room temperature for four hours to give 40.9 grams of a colorless liquid of the trimer. The yield was 85%.

To obtain the partially cured network polymer, 1.99 grams or 2.86 millimoles of the liquid trimer, obtained as described above, were mixed with 0.55 grams or 8.71 millimoles of liquid polymethylhydrosiloxane and 0.8 milligram of dicyclopentadienylplatinum chloride catalyst at room temperature and transferred to a rectangular mold. The mold was 16.02 mm×8.15mm×8.94 mm, and was made from GE RTV 11 silicone molding compound. The reaction to form the partially cured network polymer is illustrated below:

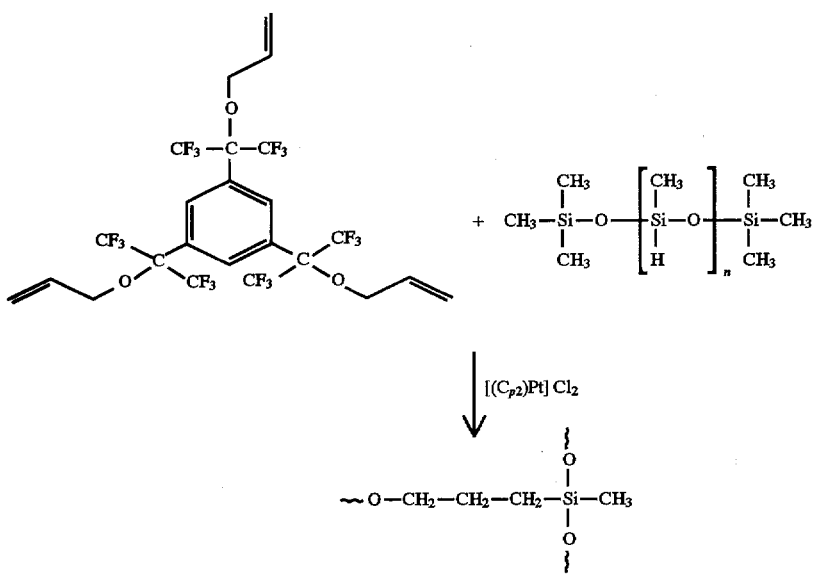

The polymethylhydrosiloxane used above was liquid with a viscosity of about 30 centistokes, n of 76, had an equivalent formula weight of 63.13, and was capped to provide the terminal groups.

The partially cured network polymer was obtained in 20 minutes after mixing it with the siloxane and was in a liquid state with increase of viscosity.

The cured network polymer was obtained by slowly raising temperature of the partially cured network polymer from room temperature to 150° C. over a period of two days and maintaining at 150° C. for an additional one hour thereafter.

The cured network polymer was in a solid state and had dielectric constant of 2.33 at a frequency of 13.2 GHz. The dielectric constant showed very little variation over the approximate frequency range of 12–18 GHz.

Many modifications and variations of the present invention are possible in light of the above teachings. It is, therefore, to be understood that within the scope of the appended claims, the invention may be practiced otherwise than as specifically described.

What is claimed is:

1. A network polymer containing the following connecting units:

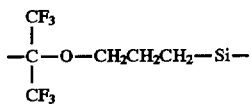

where the terminal carbon atom of each connecting unit is bonded to the same benzene ring at positions #1 and #3, wherein position #5 on the benzene ring is substituted with a connecting unit as defined above or a group selected from the group consisting of $R^2$—O—$R^3$— and $R^4$— where $R^2$ is selected from optionally fluorinated hydrocarbon groups of 1–18 carbon atoms and $R^3$ is selected from the group consisting of straight and branched chain fluorinated alkylene radicals of 1–6 carbon atoms containing 2–12 fluorine atoms and $R^4$ is selected from fluorinated hydrocarbon groups of 1–18 carbon atoms.

2. The polymer of claim 1 having viscosity from about 100 centistokes at 25° C. to a solid state.

3. The polymer of claim 1 where $R^2$ and $R^4$ are individually selected from the group consisting of fluorinated hydrocarbons of 2–6 carbon atoms.

4. The poller of claim 1 where $R^4$ is selected from the group consisting of $CF_3$ and $C_2F_5$ groups.

5. The poller of claim 4 in solid form having dielectric constant below about 2.5.

6. A reaction product of reactant X and reactant Y in presence of a catalyst, wherein reactant X is an allyletherfluoroalkylene benzene and reactant Y is a polyalkylhydrosiloxane; said allyletherfluoroalkylene benzene is selected from reactants having the following structure:

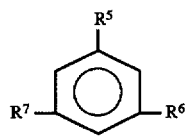

where at least two of the $R^5$, $R^6$ and $R^7$ groups have the following structure:

$CH_2$=CH—$CH_2$—O—$R^8$— where $R^8$ is selected from the group consisting of straight and branched chain fluorinated alkylene groups of 1–6 carbon atoms containing 2–12 fluorine atoms, when two of the three groups are the structures noted earlier, the third group is selected from the group consisting of the following structures:

$R^2$—O—$R^3$— and $R^4$— where $R^2$ is selected from optionally fluorinated hydrocarbon groups of 1–18 carbon atoms, $R^3$ is selected from the group consisting of straight and branched chain fluorinated alkylene radicals of 1–6 carbon atoms containing 2–12 fluorine atoms, and $R^4$ is selected from fluorinated hydrocarbon groups of 1–18 carbon atoms; and the polyalkylhydrosiloxane contains the following repeating unit:

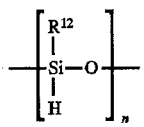

where $R^{12}$ is selected from the group consisting of lower alkyl groups containing 1–6 carbon atoms.

7. A reaction product of claim 6 wherein $R^{12}$ is selected from the group consisting of methyl and ethyl groups.

8. The reaction product of claim 7 where at least two of the $R^5$, $R^6$ and $R^7$ groups are

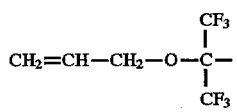

9. The reaction product of claim 8 where $R^2$ and $R^4$ are selected from the group consisting of fluorinated hydrocarbon radicals of 2–6 carbon atoms.

10. The reaction product of claim 6 where $R^2$ is

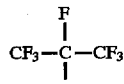

and $R^4$ is selected from the group consisting of $CF_3$ and $C_2F_5$ groups, the reaction product is in solid form with a dielectric constant below about 2.5.

11. A reaction product of reactant X and reactant Y in presence of a catalyst, where reactant X is has the following structure:

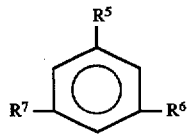

where two of the $R^5$, $R^6$ and $R^7$ groups have the following structure:

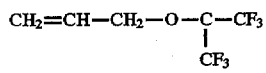

and the third is selected from the group consisting of the following structures:

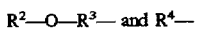

where $R^2$ is selected from the group consisting of fluorinated hydrocarbon groups of 2–6 carbon atoms, $R^3$ is a straight or branched chain fluorinated alkylene group containing 1–6 carbon atoms and 2–12 fluorine atoms, $R^4$ is selected from fluorinated hydrocarbon groups of 1–18 carbon atoms, and reactant Y is a polymethylhydrosiloxane.

12. The reaction product of claim 11 in solid form having dielectric constant below about 2.5, where $R^2$ is

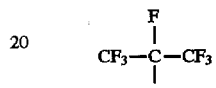

and $R^4$ is selected from the group consisting of $CF_3$ and $C_2F_5$ groups.

13. A reaction product of reactant X and reactant Y prepared in presence of a catalyst containing a metal selected from the group consisting of platinum, palladium, and rhodium, where reactant X is

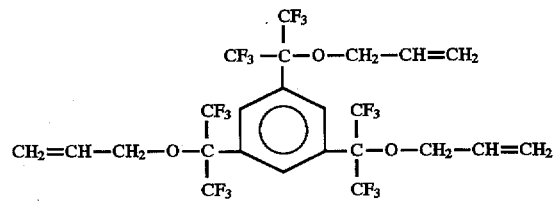

and where reactant Y is

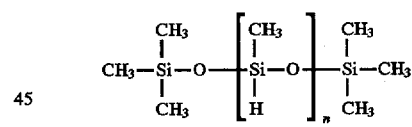

wherein n is a value such that the reactant Y is a liquid at room temperature where said reaction product has dielectric constant below about 2.5.

* * * * *